United States Patent
Watanabe et al.

(10) Patent No.: US 10,840,065 B2
(45) Date of Patent: Nov. 17, 2020

(54) ACTIVE GAS GENERATION APPARATUS INCLUDING A METAL HOUSING, FIRST AND SECOND AUXILIARY MEMBERS, AND A HOUSING CONTACT

(71) Applicant: Toshiba Mitsubishi-Electric Industrial Systems Corporation, Chuo-ku (JP)

(72) Inventors: Kensuke Watanabe, Tokyo (JP); Yoshihito Yamada, Tokyo (JP); Shinichi Nishimura, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 16/343,236

(22) PCT Filed: Dec. 5, 2016

(86) PCT No.: PCT/JP2016/085999
§ 371 (c)(1),
(2) Date: Apr. 18, 2019

(87) PCT Pub. No.: WO2018/104988
PCT Pub. Date: Jun. 14, 2018

(65) Prior Publication Data
US 2020/0176223 A1 Jun. 4, 2020

(51) Int. Cl.
*H01J 37/32* (2006.01)
(52) U.S. Cl.
CPC .... *H01J 37/32348* (2013.01); *H01J 37/3244* (2013.01); *H01J 37/32568* (2013.01); *H01J 2237/332* (2013.01)
(58) Field of Classification Search
CPC ............. H01J 37/32348; H01J 37/3244; H01J 37/32568; H01J 2237/332
See application file for complete search history.

(56) References Cited

U.S. PATENT DOCUMENTS

| | | | |
|---|---|---|---|
| 6,245,396 B1* | 6/2001 | Nogami | C23C 16/4405 118/723 ER |
| 2006/0096539 A1* | 5/2006 | Kawasaki | C23C 16/509 118/723 R |

(Continued)

FOREIGN PATENT DOCUMENTS

| | | |
|---|---|---|
| JP | 5328685 B2 | 10/2013 |
| JP | 5694543 B2 | 4/2015 |

(Continued)

OTHER PUBLICATIONS

International Search Report dated Mar. 7, 2017 in PCT/JP2016/085999 filed Dec. 5, 2016.

*Primary Examiner* — Borna Alaeddini
(74) *Attorney, Agent, or Firm* — Xsensus LLP

(57) ABSTRACT

An active gas generator that generates active gas by activating supplied material gas through discharge in a discharge space formed between a high-voltage side electrode component and a ground side electrode component of an active gas generation electrode group. A combined structure of covers completely separates the discharge space from an alternating-current voltage application space, and includes, independently from the alternating-current voltage application space, a material gas flow path for a material gas supply path, through which externally supplied material gas is guided to the discharge space. A housing contact space formed between a metal housing and each of the covers and an electrode component installation table is completely separated from the alternating-current voltage application space and the discharge space.

4 Claims, 3 Drawing Sheets

(56) References Cited

U.S. PATENT DOCUMENTS

| | | | |
|---|---|---|---|
| 2010/0193129 A1* | 8/2010 | Tabata | H01J 37/32009 156/345.35 |
| 2014/0174359 A1* | 6/2014 | Tabata | H01J 37/32348 118/723 ER |
| 2017/0275165 A1* | 9/2017 | Wada | C01B 13/11 |

FOREIGN PATENT DOCUMENTS

| | | | | |
|---|---|---|---|---|
| WO | WO-2008123142 A1 | * | 10/2008 | H05H 1/2406 |
| WO | WO-2008132901 A1 | * | 11/2008 | H01J 37/32825 |

* cited by examiner

ACTIVE GAS GENERATION APPARATUS INCLUDING A METAL HOUSING, FIRST AND SECOND AUXILIARY MEMBERS, AND A HOUSING CONTACT

TECHNICAL FIELD

The present invention relates to an active gas generation apparatus including two electrodes installed in parallel to obtain active gas through energy of discharge caused by applying high voltage between the electrodes.

BACKGROUND ART

In an active gas generation apparatus including two electrodes installed in parallel to obtain active gas through the energy of a discharge phenomenon caused in a discharge space between the electrodes by applying high voltage between the electrodes, typically, alternating-current high voltage is applied to one of the electrodes, and the other electrode is set to a reference voltage such as a ground level.

In such an active gas generation apparatus, a high voltage of several kVrms (root mean square) is applied to one of electrodes as a high voltage power supply part. In a space other than the discharge space formed between the pair of electrodes, the distance between the power supply part and a ground part (the other electrode and any component place electrically connected therewith) is sufficiently provided to prevent insulation breakdown of gas in the space. However, from a microscopic viewpoint, it is impossible to avoid concentration of electric field intensity enough to cause insulation breakdown of a surrounding gas layer due to the shape and surface state of a metal component of the power supply part.

When insulation breakdown occurs in a space other than the discharge space, a phenomenon that causes evaporation of the constituent element of any component nearby occurs. When the nearby component is made of metal, the above-described phenomenon causes metal contamination in a semiconductor deposition process.

Examples of active gas generation apparatuses developed with such metal contamination taken into consideration include a plasma generation apparatus disclosed in Patent Document 1 and a plasma processing apparatus disclosed in Patent Document 2.

The plasma generation apparatus disclosed in Patent Document 1 performs dielectric barrier discharge at a discharge part provided between a high-voltage side electrode component and a ground side electrode component facing each other, and generates active gas by causing material gas to pass through the discharge part. In this apparatus, the discharge part and an alternating-current voltage application part are not separated from each other but exist in an identical space. After having passed through the alternating-current voltage application part, the material gas is supplied to the discharge space and finally to a processing chamber.

The plasma processing apparatus disclosed in Patent Document 2 employs a structure in which insulators are inserted and sealed at outer edge parts of electrode components facing each other. This structure is intended to prevent anomalous discharge from a discharge part to a housing (including a ground electrode) in which the electrode components are installed.

PRIOR ART DOCUMENTS

Patent Documents

Patent Document 1: Japanese Patent No. 5694543

Patent Document 2: Japanese Patent No. 5328685 (FIG. 10)

SUMMARY

Problem to be Solved by the Invention

However, in the plasma generation apparatus disclosed in Patent Document 1, discharge due to insulation breakdown of the material gas does not necessarily occur only at the discharge part. From a macroscopic viewpoint, it is designed to provide a sufficient insulation distance to prevent unnecessary discharge at a place other than the discharge part. Examples of such unnecessary discharge include anomalous discharge between a metal electrode of the high-voltage side electrode component through which alternating-current voltage is applied and a metal housing that houses the electrode component.

However, from a microscopic viewpoint, irregularities are inevitably formed on the surface of a current introduction terminal through which alternating-current voltage is applied and the surface of any metal component or the like connected therewith. It is extremely difficult to eliminate the probability that strong electric field regions are formed around some convex portions of the irregularities, and as a result, gas insulation breakdown, in other words, anomalous discharge occurs.

Thus, the plasma generation apparatus disclosed in Patent Document 1 has such a problem that the above-described insulation breakdown causes evaporation of any constituent element installed nearby, and the evaporated constituent element is mixed into the material gas and supplied to the discharge part and the processing chamber, which causes semiconductor metal contamination.

The plasma processing apparatus disclosed in Patent Document 2 is insufficient to prevent metal contamination mixture when anomalous discharge occurs. This is because the discharge part and the alternating-current voltage application part still exist in an identical space, and the material gas having passed through the alternating-current voltage application part proceeds to the discharge part and generates active gas, which is the same structural problem. Specifically, similarly to the plasma generation apparatus disclosed in Patent Document 1, the plasma processing apparatus disclosed in Patent Document 2 cannot avoid generation of metal contamination, and accordingly has the problem of degradation of the quality of generated active gas.

The present invention is intended to solve the problems as described above and provide an active gas generation apparatus capable of generating high quality active gas.

Means to Solve the Problem

An active gas generation apparatus according to the present invention includes: an active gas generation electrode group including a first electrode component and a second electrode component provided below the first electrode component; an alternating-current power source unit configured to apply alternating-current voltage to the first and second electrode components so that the first electrode component is at high voltage, a discharge space being formed between the first and second electrode components through application of the alternating-current voltage by the alternating-current power source unit, active gas obtained by activating material gas supplied to the discharge space being ejected through a gas ejection port provided in the second electrode component; a first auxiliary member provided to form an alternating-current voltage application space between the first auxiliary member and the first electrode component separately from the discharge space; a second auxiliary member made of a non-metallic material and supporting the active gas generation electrode group from the second electrode component side, the second auxiliary member including an auxiliary member gas discharge port through which active gas ejected from the gas ejection port passes; and a metal housing that houses all of the active gas generation electrode group and the second auxiliary member and at least part of the first auxiliary member, the housing including a housing gas discharge port through which the active gas passing through the auxiliary member gas discharge port is discharged to the outside, a housing contact space separated from the discharge space being provided between the housing and each of the first and second auxiliary members. The first auxiliary member includes a material gas flow path for a material gas supply path, through which externally supplied material gas is guided to the discharge space, independently from the alternating-current voltage application space and the housing contact space so that gas flow in the discharge space and gas flow in the alternating-current voltage application space are separated from each other and gas flow in the discharge space and gas flow in the housing contact space are separated from each other.

Effects of the Invention

In an active gas generation apparatus as the present application invention according to claim 1, an alternating-current voltage application space is provided separately from a discharge space, and a first auxiliary member includes a material gas flow path for a material gas supply path, through which externally supplied material gas is guided to the discharge space, independently from the alternating-current voltage application space so that gas flow in the discharge space and gas flow in the alternating-current voltage application space are separated from each other.

Thus, it is possible to reliably avoid a first mixing phenomenon in which an evaporation material, such as the material of a first electrode component, generated when anomalous discharge occurs in the alternating-current voltage application space is mixed into the discharge space directly or through the material gas supply path.

In addition, in the present application invention according to claim 1, a housing contact space is provided separately from the discharge space, and the first auxiliary member includes the material gas flow path for the material gas supply path independently from the housing contact space so that gas flow in the discharge space and gas flow in the housing contact space are separated from each other.

Thus, it is possible to reliably avoid a second mixing phenomenon in which an evaporation material generated in the housing contact space is mixed into the discharge space.

As a result, the active gas generation apparatus as the present application invention according to claim 1 can reliably avoid the first and second mixing phenomena described above and discharge high quality active gas to the outside.

These and other objects, features, aspects and advantages of the present invention will become more apparent from the following detailed description of the present invention when taken in conjunction with the accompanying drawings.

DESCRIPTION OF EMBODIMENTS

<Outline of Active Gas Generation Apparatus>

The following describes particulars of an active gas generation apparatus common to Embodiments 1 to 3 described below. An active gas generation electrode group of dielectric barrier discharge is formed by opposingly disposing a pair of a high-voltage side electrode component and a ground side electrode component separately from each other by a gap length. In the active gas generation electrode group, a space formed between the high-voltage side electrode component and the ground side electrode component serves as a discharge space.

The active gas generation electrode group is housed in a metallic housing, and the active gas generation apparatus including the active gas generation electrode group and the housing is disposed right above a processing chamber in which a silicon wafer is subjected to deposition. A metal electrode is metallized on part of the surface of a dielectric electrode in the active gas generation electrode group so that the dielectric electrode and the metal electrode are integrally formed. The metallization is performed by a print burning method, a sputtering process, a vapor deposition process, or the like.

The metal electrode is connected with a high frequency power source. The ground side electrode component is grounded together with the housing, and fixed to a reference potential. Dielectric barrier discharge is caused in the discharge space of the active gas generation electrode group by applying an AC voltage $V0p$ (zero peak value) of 10 kHz to 100 kHz and 2 kV to 10 kV to the active gas generation electrode group from the high frequency power source.

The active gas generation apparatus is supplied with material gas of nitrogen, oxygen, rare gases, hydrogen, fluorine, and the like from the outside through a gas supply port (material gas flow path). The material gas flows to the discharge space inside the electrode through a material gas supply path provided at an outer peripheral part of the active gas generation electrode group, and is activated in the discharge space inside. Gas containing this active gas is ejected through a gas ejection port provided at the ground side electrode component to the processing chamber outside the housing, and performs deposition.

<Embodiment 1>

Figure 1:
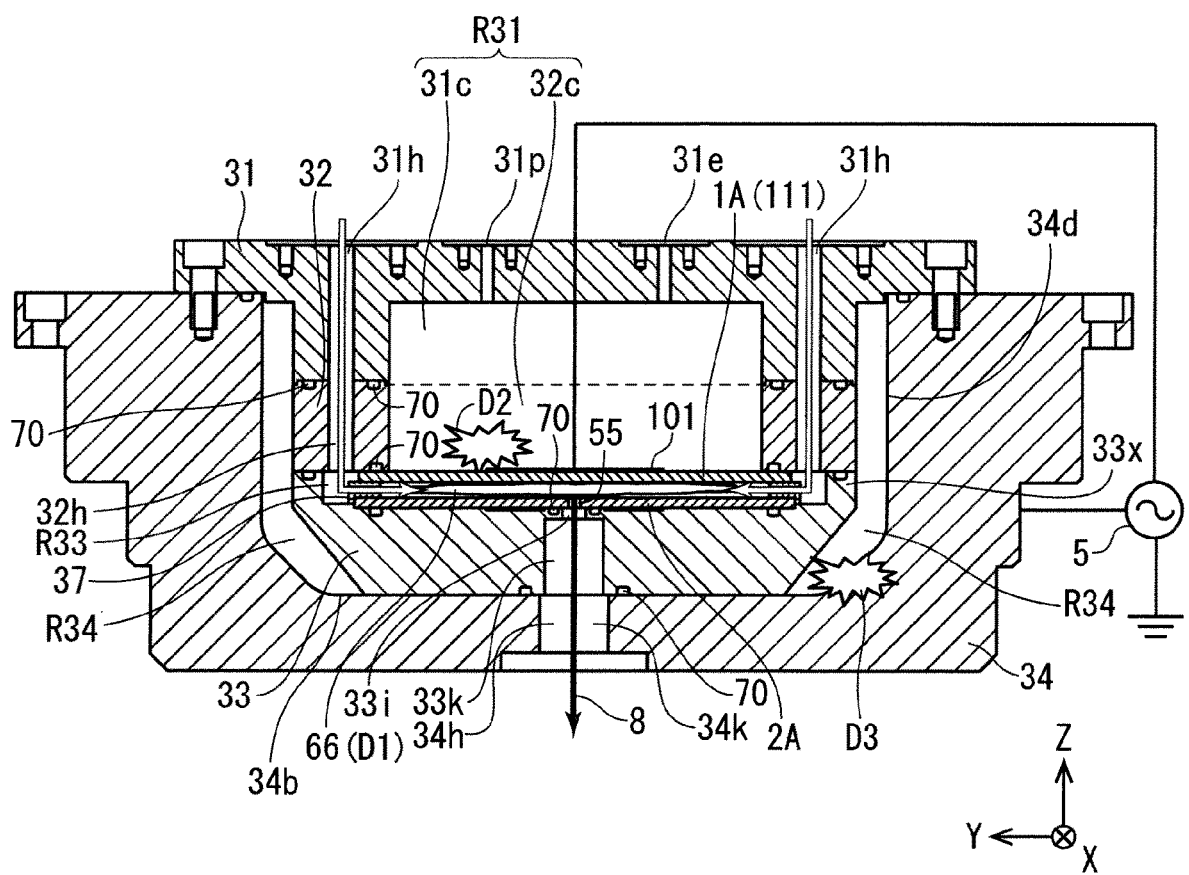
FIG. 1 is an explanatory diagram schematically illustrating a sectional structure of an active gas generation apparatus according to Embodiment 1 of the present invention.
Figure 2:
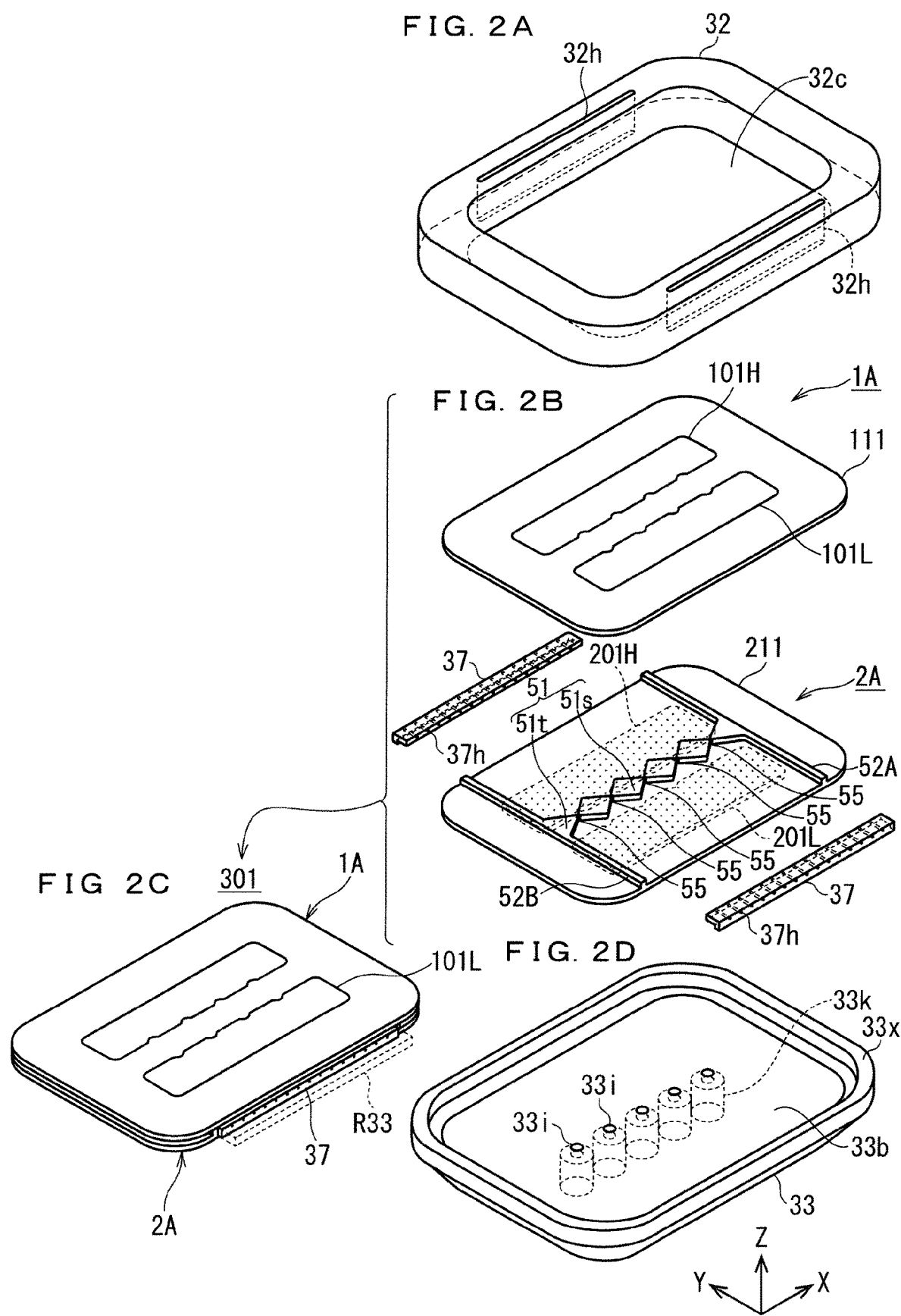
FIG. 2 is an explanatory diagrams illustrating a main configuration part of the active gas generation apparatus according to Embodiment 1 in a disassembled state.

FIG. 1 is an explanatory diagram schematically illustrating a sectional structure of an active gas generation apparatus according to Embodiment 1 of the present invention. FIG. 2 is an explanatory diagrams illustrating a main configuration part of the active gas generation apparatus according to Embodiment 1 in a disassembled state. FIGS. 1 and 2 and FIGS. 3 and 4 to be described later each illustrate an XYZ orthogonal coordinate system.

As illustrated in FIG. 2B and 2C, an active gas generation electrode group 301 includes a high-voltage side electrode component 1A (first electrode component) and a ground side electrode component 2A (second electrode component) provided below the high-voltage side electrode component 1A.

The ground side electrode component 2A includes a dielectric electrode 211 and metal electrodes 201H and 201L, and the dielectric electrode 211 has a rectangular flat plate structure having a longitudinal direction along the X direction and a transverse direction along the Y direction.

A plurality of gas ejection ports 55 are provided in the X direction at the center of the dielectric electrode 211. The plurality of gas ejection ports 55 penetrate from the upper surface to the lower surface of the dielectric electrode 211.

In addition, a wedge-shaped stepped part 51 is formed not to overlap with the plurality of gas ejection ports 55 in plan view but to have a shorter formation width in the Y direction at a position closer to each of the plurality of gas ejection ports 55 in plan view. Specifically, the wedge-shaped stepped part 51 is formed as an assembly of four rhombus singular parts 51s each formed in a rhombic shape in plan view between the five gas ejection ports 55 and separated from each other, and two triangle singular parts 51t provided outside the gas ejection ports 55 at both ends among the five gas ejection ports 55 and each formed in a substantially isosceles triangular shape in plan view.

The dielectric electrode 211 further includes straight stepped parts 52A and 52B formed protruding upward at both end sides in the X direction. The straight stepped parts 52A and 52B extends in the Y direction over the total length of the dielectric electrode 211 in the transverse direction in plan view, and the gap length of a discharge space 66 is defined by the formation heights of the straight stepped parts 52A and 52B together with the formation height of the wedge-shaped stepped part 51.

As illustrated in FIG. 2B, the metal electrodes 201H and 201L are formed on the lower surface of the dielectric electrode 211, and disposed facing each other with a central region of the dielectric electrode 211 interposed therebetween in plan view. The metal electrodes 201H and 201L each have a substantially rectangular shape in plan view, and have a longitudinal direction along the X direction and a mutually facing direction along the Y direction orthogonal to the X direction.

The metal electrodes 201H and 201L are metallized on the lower surface of the dielectric electrode 211, and as a result, integrally formed with the dielectric electrode 211, constituting the ground side electrode component 2A. The metallization is performed by, for example, a print burning method, a sputtering process, and an evaporation process.

Similarly to the dielectric electrode 211, a dielectric electrode 111 of the high-voltage side electrode component 1A has a rectangular flat plate structure having a longitudinal direction along the X direction and a transverse direction along the Y direction. The dielectric electrode 111 and the dielectric electrode 211 are made of, for example, ceramic.

Metal electrodes 101H and 101L are formed on the upper surface of the dielectric electrode 111 and disposed facing each other in plan view with, interposed therebetween, a central region in the same shape corresponding to the central region of the dielectric electrode 211. Similarly to the metal electrodes 201H and 201L, the metal electrodes 101H and 101L each have a substantially rectangular shape in plan view, and have a longitudinal direction along the X direction and a mutually facing direction along the Y direction orthogonal to the X direction. Similarly to the metal electrodes 201H and 201L, the metal electrodes 101H and 101L can be formed on the upper surface of the dielectric electrode 111 by metallization.

As illustrated in FIG. 2C, the active gas generation electrode group 301 can be assembled by disposing the high-voltage side electrode component 1A on the ground side electrode component 2A. In this case, the high-voltage side electrode component 1A is stacked and combined on the ground side electrode component 2A while the central region of the dielectric electrode 111 in the high-voltage side electrode component 1A and the central region of the dielectric electrode 211 in the ground side electrode component 2A are positioned to overlap with each other in plan view. This can finally complete the active gas generation electrode group 301.

A pair of spacers 37 are provided between the straight stepped parts 52A and 52B on both side surfaces extending in the X direction in the active gas generation electrode group 301. The pair of spacers 37 are provided between the high-voltage side electrode component 1A and the ground side electrode component 2A, and the formation heights thereof define the gap length of the discharge space 66 together with the wedge-shaped stepped part 51 and the straight stepped parts 52A and 52B described above. The spacers 37 are made of a non-metallic material, and desirably made of the same material as that of the dielectric electrodes 111 and 211.

In addition, the pair of spacers 37 are each provided with a plurality of through-holes 37h extending in the Y direction so that material gas can be supplied from outside of the active gas generation electrode group 301 into the discharge space 66 between the high-voltage side electrode component 1A and the ground side electrode component 2A through the plurality of through-holes 37h.

The discharge space is defined to be a region in which the metal electrodes 101H and 101L overlap with the metal electrodes 201H and 201L in plan view in a dielectric space across which the dielectric electrode 111 and the dielectric electrode 211 included in the active gas generation electrode group 301 face each other.

The metal electrodes 101H and 101L and the metal electrodes 201H and 201L are connected with a (high-voltage) high frequency power source 5 (alternating-current power source unit). Specifically, the metal electrodes 201H and 201L of the ground side electrode component 2A are grounded through a metal component (not illustrated) selectively provided inside a metal housing 34 and an electrode component installation table 33, and in the present embodiment, an alternating-current voltage having a zero peak value fixed to 2 kV to 10 kV and a frequency set to be 10 kHz to 100 kHz is applied between each of the metal electrodes 101H and 101L and the corresponding one of the metal electrodes 201H and 201L from the high frequency power source 5. The electrode component installation table 33 except for the above-described metal component is made of an insulating material, for example, ceramic. The above-described metal component may be installed such that, for example, like an active gas discharge port 33k to be described later, a plurality of through-holes vertically penetrating through the electrode component installation table 33 are provided, and the above-described metal component is provided in each of the plurality of through-holes to electrically connect the metal electrodes 201H and 201L of the ground side electrode component 2A to a metal housing 44.

As illustrated in FIG. 1, in the active gas generation apparatus according to Embodiment 1, the active gas generation electrode group 301 (including the high-voltage side electrode component 1A and the ground side electrode component 2A) having the above-described configuration is housed in the metal housing 34 by using a cover 31, a cover 32, and the electrode component installation table 33.

As described above, the high frequency power source 5 (alternating-current power source unit) configured to apply alternating-current voltage so that the high-voltage side electrode component 1A is at a high voltage relative to the active gas generation electrode group 301 is provided. Through the alternating-current voltage application by the high frequency power source 5, the discharge space 66 is formed between the high-voltage side electrode component 1A and the ground side electrode component 2A, and active gas obtained by activating the material gas supplied to the discharge space 66 is ejected downward through the plurality of gas ejection ports 55 provided in the ground side electrode component 2A.

A first auxiliary member formed by combining the covers 31 and 32 is provided above the high-voltage side electrode component 1A to form, together with the high-voltage side electrode component 1A, an alternating-current voltage application space R31 separated from the discharge space 66.

The electrode component installation table 33 as a second auxiliary member has a main surface 33b (refer to FIG. 2D) on which the entire lower surface of the ground side electrode component 2A is disposed to support the active gas generation electrode group 301 from the ground side electrode component 2A side. The outer peripheral part of the electrode component installation table 33 includes an outer peripheral protrusion part 33x protruding upward (+Z direction) from the main surface 33b, and the outer peripheral protrusion part 33x surrounds the entire active gas generation electrode group 301 to form a side surface space R33 (refer to FIG. 1 and FIG. 2C) between the outer peripheral protrusion part 33x and the spacers 37.

As illustrated in FIG. 1 and FIG. 2D, the electrode component installation table 33 includes a plurality of active gas passing ports 33i and a plurality of active gas discharge ports 33k through which the active gas ejected from the plurality of gas ejection ports 55 passes and is guided downward. The plurality of active gas passing ports 33i are disposed to coincide with the plurality of gas ejection ports 55 in plan view, and the plurality of active gas discharge ports 33k are provided below the plurality of active gas passing ports 33i, respectively. A combination of each active gas passing port 33i and the corresponding active gas discharge ports 33k forms an auxiliary member gas discharge port through which the active gas ejected from the corresponding gas ejection port 55 passes.

As illustrated in FIG. 2A, the cover 32 as part of the first auxiliary member is formed in a rectangular annular shape in plan view and disposed on an end part of the high-voltage side electrode component 1A and the outer peripheral protrusion part 33x of the electrode component installation table 33. A hollow region 32c as an inner periphery region of the cover 32 is smaller than the shape of the high-voltage side electrode component 1A in plan view, and disposed on the high-voltage side electrode component 1A and within the high-voltage side electrode component 1A. An outer peripheral region of the electrode component installation table 33 is larger than the high-voltage side electrode component 1A in plan view, and disposed including the entire high-voltage side electrode component 1A.

In addition, as illustrated in FIG. 1 and FIG. 2A, the cover 32 includes a material gas flow path 32h penetrating through the cover 32 in the vertical direction (Z direction). The material gas flow path 32h linearly extends in the X direction at a central part in a long side region of the cover 32 extending in the X direction. The side surface space R33 is positioned below the material gas flow path 32h.

In addition, the cover 31 is disposed on the cover 32. The cover 31 has a lower part formed a rectangular annular shape identical to that of the cover 32 in plan view, and an upper part formed in a rectangular shape in plan view, an end part of the upper part being disposed on the upper surface of the metal housing 34. A hollow region 31c as an inner periphery region of the cover 31 has a shape identical to that of the hollow region 32c of the cover 32 in plan view. The end part of the upper part of the cover 31 is fixed to the upper surface of the metal housing 34 by using fixation means such as a bolt.

As illustrated in FIG. 1, the cover 31 includes a vertically penetrating material gas flow path 31h formed in a cylindrical shape, and part of the material gas flow path 32h is positioned below the material gas flow path 31h. Similarly to the material gas flow path 32h, the material gas flow path 31h may be linearly formed extending in the X direction at a central part in a long side region of the cover 31 extending in the X direction so that the entire material gas flow path 32h is positioned below the material gas flow path 31h.

In addition, the cover 31 includes, at the upper part, a vertically penetrating purge gas supply port 31p as a second gas supply port for purge gas as second gas other than the material gas, and a vertically penetrating purge gas discharge port 31e as a second gas discharge port. The purge gas supply port 31p and the purge gas discharge port 31e are each formed in a cylindrical shape. The purge gas supply port 31p and the purge gas discharge port 31e are each provided so that a lower part thereof reaches the hollow region 31c. The purge gas supply port 31p and the purge gas discharge port 31e are provided independently from the material gas flow path 31h to avoid mixture of the purge gas and the material gas. The purge gas supplied through the purge gas supply port 31p is nitrogen or inert gas. The purge gas supply port 31p and the purge gas discharge port 31e are also formed independently from the discharge space 66 and a housing contact space R34 to be described later.

The first auxiliary member as a combined structure of the covers 31 and 32 provides the alternating-current voltage application space R31 composed of the hollow region 31c of the cover 31 and the hollow region 32c of the cover 32 above the high-voltage side electrode component 1A.

Since the covers 31 and 32 are formed in rectangular annular shapes in plan view as described above, the alternating-current voltage application space R31 is an independent space completely separated from the other space by the high-voltage side electrode component 1A and the covers 31 and 32. The side surface space R33 is completely separated from the other space except for the discharge space 66 and the material gas flow paths 31h and 32h by a bottom surface of the cover 32, an end part region of the main surface 33b of the electrode component installation table 33, and the outer peripheral protrusion part 33x.

In addition, a material gas supply path connected with the discharge space 66 from the outside above the material gas flow path 31h is formed by the material gas flow path 31h, the material gas flow path 32h, the side surface space R33, and the plurality of through-holes 37h provided in the spacers 37. The material gas flow paths 31h and 32h are provided independently from the hollow regions 31c and 32c.

Thus, the material gas supply path guided to the discharge space 66 from above the material gas flow path 31h is formed independently from the alternating-current voltage application space R31 by the material gas flow paths 31h and 32h, the side surface space R33, and the plurality of through-holes 37h of the spacers 37.

As a result, the alternating-current voltage application space R31 and the discharge space 66 are not spatially connected with each other through the material gas supply path, and thus gas flow can be completely separated between the alternating-current voltage application space R31 and the discharge space 66.

The cover 32 is made of a non-metallic material. The cover 32 is desirably made of the same material as that of the dielectric electrodes 111 and 211 to handle any anomalous discharge occurring in the material gas flow path 32h. The cover 31 is made of a metallic material. The formation height of the cover 32 is set to provide a sufficient distance from the metal electrodes 101H and 101L as high-voltage application regions so that the cover 31 is installed in a region having a low electric field intensity.

Alternatively, the cover 32 may be made of an insulation material, such as quartz or silicon nitride, that is generated by the active gas and causes no problem inside the generation apparatus. In this case, no problem occurs to deposition when anomalous discharge occurs in the material gas supply path (for example, the cover 32 and the spacers 37) and a constituent element evaporates and mixes into the material gas.

In this manner, any metallic material is completely excluded from the material gas supply path provided at a position relatively close to the high-voltage side electrode component 1A as a strong electric field region, thereby preventing metal contamination due to the metal component.

The metal housing 34 houses, in an internal hollow space part, all of the active gas generation electrode group 301 (the high-voltage side electrode component 1A and the ground side electrode component 2A), the cover 32, and the electrode component installation table 33, and the lower part of the cover 31.

The electrode component installation table 33 is disposed on a bottom surface 34b of the hollow space part of the metal housing 34, and an active gas discharge port 34k (housing gas discharge port) is positioned below the active gas discharge ports 33k. With this configuration, the active gas ejected from the gas ejection ports 55 is ejected, along gas flow 8, to an external processing chamber provided below or the like through the active gas passing ports 33i, the active gas discharge ports 33k, and the active gas discharge port 34k.

The housing contact space R34 is provided between a side surface 34d of the hollow space part of the metal housing 34, and each of the electrode component installation table 33, the cover 32, and a side surface region at a lower part of the cover 31, and part of a bottom surface region of the upper part of the cover 31. In this manner, the housing contact space R34 is provided between the metal housing 34 and the outside of the covers 31 and 32 and the electrode component installation table 33. The housing contact space R34 is provided mainly to provide an insulation distance from the metal electrodes 101H and 101L of the active gas generation electrode group 301.

As described above, the alternating-current voltage application space R31 is an internal space completely independent from the other space by the high-voltage side electrode component 1A and the covers 31 and 32, and the discharge space 66 is an internal space independent from the other space except for the material gas supply path. With this configuration, the housing contact space R34 is separated from the alternating-current voltage application space R31 and the discharge space 66.

In addition, since the material gas flow paths 31h and 32h for the material gas supply path are provided independently from the housing contact space R34, the above-described material gas supply path reaching the discharge space 66 is an internal space independent from the other space, and accordingly, gas flow in the discharge space 66 is completely separated from gas flow in the housing contact space R34.

In this manner, the alternating-current voltage application space R31, the discharge space 66, and the material gas supply path including the material gas flow paths 31h and 32h are provided independently from the housing contact space R34 so that gas flow therein is separated from gas flow in the housing contact space R34.

An O ring 70 is provided surrounding the material gas flow paths 31h and 32h at a contact surface between the cover 31 and the cover 32. Similarly, another O ring 70 is provided surrounding the material gas flow path 32h and the side surface space R33 at a contact surface between the cover 32 and the electrode component installation table 33. These O rings 70 increase the degree of sealing of the material gas supply path from the other space.

In addition, another O ring 70 is provided surrounding the active gas passing ports 33i at a contact surface between the ground side electrode component 2A and the electrode component installation table 33, and another O ring 70 is provided surrounding the active gas discharge ports 33k and 34k at a contact surface between the electrode component installation table 33 and the metal housing 34. These O rings 70 increase the degrees of sealing of the active gas passing ports 33i, the active gas discharge ports 33k, and the active gas discharge port 34k from the other space. In FIG. 1, each O ring 70 is illustrated with a small circle.

Figure 4:
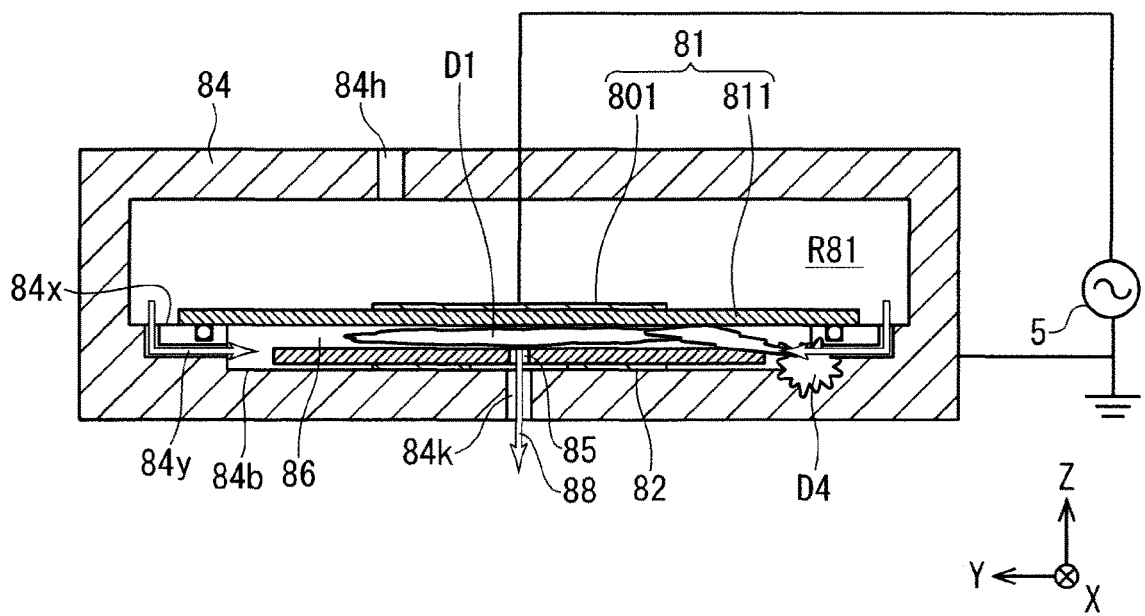
FIG. 4 is an explanatory diagram schematically illustrating a typical structure of a conventional active gas generation apparatus.

FIG. 4 is an explanatory diagram schematically illustrating a typical structure of a conventional active gas generation apparatus. As illustrated in FIG. 4, a metal housing 84 houses an active gas generation electrode group composed of a high-voltage side electrode component 81 and a ground side electrode component 82. The high-voltage side electrode component 81 is formed by providing a metal electrode 801 on a dielectric electrode 811, and the ground side electrode component 82 is formed by providing a metal electrode below a dielectric electrode.

The high frequency power source 5 is provided between the metal electrode 801 of the high-voltage side electrode component 81 and the metal housing 84, and the ground level is electrically connected with the metal electrode of the ground side electrode component 82 through the metal housing 84.

A discharge space 86 is formed between the high-voltage side electrode component 81 and the ground side electrode component 82 through high-voltage application by the high frequency power source 5. The active gas is ejected downward through a gas ejection port 85 provided in the ground side electrode component 82.

The metal housing 84 includes a main surface 84b on a bottom surface of a hollow space part, and an outer peripheral protrusion part 84x protruding upward (+Z direction) from the main surface 84b along the outer periphery of the main surface 84b. The ground side electrode component 82 is disposed on the main surface 84b, and an end part of a dielectric electrode 812 of the high-voltage side electrode component 81 is disposed on the outer peripheral protrusion part 84x.

The metal housing 84 is also provided with a material supply port 84h at an upper part, and an active gas discharge port 84k positioned below the gas ejection port 85 at a lower part. With this configuration, the active gas ejected from the gas ejection ports 55 is discharged to the outside through the active gas discharge port 84k along gas flow 88.

An alternating-current voltage application space R81 is formed by the high-voltage side electrode component 81 and the metal housing 84 and connected with the discharge space 86 through a flow path 84y provided in the outer peripheral protrusion part 84x.

The following describes effects of the active gas generation apparatus according to Embodiment 1 in comparison with the conventional active gas generation apparatus illustrated in FIG. 4.

In the active gas generation apparatus according to Embodiment 1, the alternating-current voltage application space R31 is separated from the discharge space 66, and the first auxiliary member composed of the covers 31 and 32 includes the material gas flow paths 31h and 32h for the material gas supply path that guide externally supplied material gas to the discharge space 66 independently from the alternating-current voltage application space R31, thereby completely separating gas flow in the discharge space 66 from gas flow in the alternating-current voltage application space R31.

This can reliably avoid a first mixing phenomenon in which an evaporation material, such as the material of the high-voltage side electrode component 1A (the metal electrodes 101H and 101L, in particular), generated when anomalous discharge D2 occurs in the alternating-current voltage application space R31 is mixed into the discharge space 66 directly or through the material gas supply path. p However, in the conventional active gas generation apparatus illustrated in FIG. 4, since the alternating-current voltage application space R81 and the discharge space 86 are spatially connected with each other through the flow path 84y, it is impossible to avoid the first mixing phenomenon in which the above-described evaporation material generated in the alternating-current voltage application space R81 is mixed into the flow path 84y as the material gas supply path.

In addition, in the active gas generation apparatus according to Embodiment 1, the housing contact space R34 is separated from the discharge space 66, and the first auxiliary member composed of the covers 31 and 32 includes the material gas flow paths 31h and 32h for the material gas supply path independently from the housing contact space R34, thereby completely separating gas flow in the discharge space 66 from gas flow in the housing contact space R34.

With this configuration, it is also possible to reliably avoid a second mixing phenomenon in which an evaporation material generated by anomalous discharge D3 or the like in the housing contact space R34 is mixed into the discharge space 66.

However, in the conventional active gas generation apparatus, anomalous discharge D4 may occur from the alternating-current voltage application space R81 toward the metal housing 84 through the high-voltage side electrode component 81 and the ground side electrode component 82. In this case, it is impossible to avoid the second mixing phenomenon in which an evaporation material generated in a space (space corresponding to the housing contact space R34 in Embodiment 1) on the main surface 84b having an upper part exposed with no ground side electrode component 82 disposed above is mixed into the discharge space 86.

As a result, the active gas generation apparatus according to Embodiment 1 can reliably avoid the above-described first and second mixing phenomena that cannot be avoided by the conventional active gas generation apparatus, thereby achieving the effect of discharging high quality active gas to the outside.

In addition, in the active gas generation apparatus according to Embodiment 1, the purge gas as the second gas other than the material gas can be supplied into the alternating-current voltage application space R31 through the purge gas supply port 31p. Thus, any evaporation material generated when anomalous discharge occurs in the alternating-current voltage application space R31 can be removed to the outside through the purge gas discharge port 31e.

Since the above-described material gas supply path is provided independently from the alternating-current voltage application space R31, the material gas is not affected by the purge gas supply.

<Embodiment 2>

Figure 3:
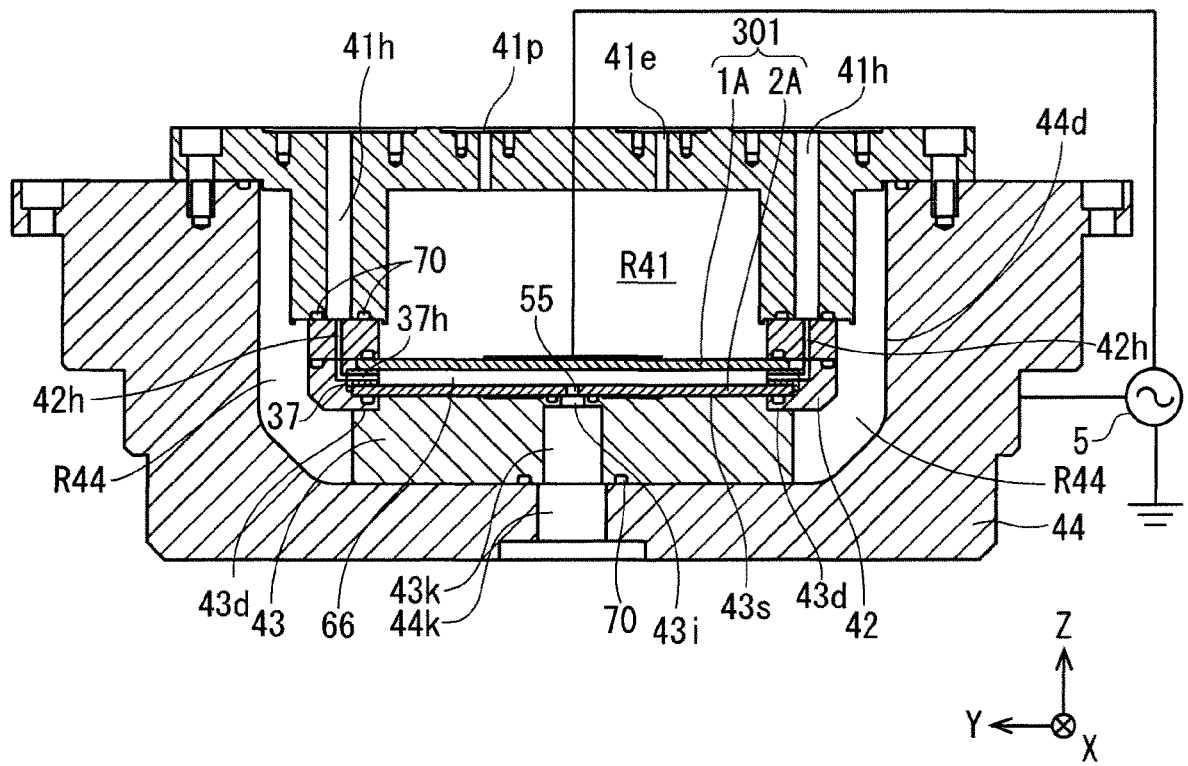
FIG. 3 is an explanatory diagram schematically illustrating a sectional structure of an active gas generation apparatus according to Embodiment 2 of the present invention.

FIG. 3 is an explanatory diagram schematically illustrating a sectional structure of an active gas generation apparatus according to Embodiment 2 of the present invention.

The active gas generation electrode group including the high-voltage side electrode component 1A, the ground side electrode component 2A, and the spacers 37 has the same configuration as that of the active gas generation electrode group 301 in Embodiment 1.

A cover 41 and a gas seal unit cover 42 included in the first auxiliary member correspond to the cover 31 and the cover 32 in Embodiment 1. A material gas flow path 41h, a purge gas supply port 41p (second gas supply port), and a purge gas discharge port 41e (second gas discharge port) formed in the cover 41 correspond to the material gas flow path 31h, the purge gas supply port 31p, and the purge gas discharge port 31e formed in the cover 31.

A material gas flow path 42h formed in the gas seal unit cover 42 corresponds to the material gas flow path 32h formed in the cover 32.

An electrode component installation table 43 as the second auxiliary member corresponds to the electrode component installation table 33 in Embodiment 1, and an active gas passing port 43i and an active gas discharge port 43k correspond to the active gas passing ports 33i and the active gas discharge ports 33k. The auxiliary member gas discharge port is formed by the active gas passing port 43i and an active gas discharge port 44k.

The metal housing 44 corresponds to the metal housing 34 in Embodiment 1, and the active gas discharge port 44k corresponds to the active gas discharge port 34k.

An alternating-current voltage application space R41 corresponds to the alternating-current voltage application space R31, and a housing contact space R44 corresponds to the housing contact space R34.

The following description is mainly made on any characteristic part of Embodiment 2. Components having an identical reference sign or a correspondence relation described above have the same characteristics as those in Embodiment 1 except for contents described below, and description thereof will be omitted.

The gas seal unit cover 42 holds an outer peripheral part of each of the high-voltage side electrode component 1A and the ground side electrode component 2A by vertically sandwiching the part. In other words, the gas seal unit cover 42 functions as an electrode group holder configured to solely hold the active gas generation electrode group 301.

In the gas seal unit cover 42, the material gas flow path 42h is bent toward the spacers 37 halfway through its length and directly connected with the plurality of through-holes 37h of the spacers 37.

In the electrode component installation table 43, the ground side electrode component 2A is disposed on a main surface 43s at an upper part, and part of the gas seal unit cover 42 is disposed on a stepped part 43d provided in an outer peripheral region of the main surface 43s and having a formation height lower than that of the main surface 43s, thereby supporting the active gas generation electrode group 301 including the gas seal unit cover 42 from the ground side electrode component 2A side.

In this manner, the electrode component installation table 43 as the second auxiliary member, together with the gas seal unit cover 42, supports the active gas generation electrode group 301 from the ground side electrode component 2A side.

Similarly to the covers 31 and 32 in Embodiment 1, the first auxiliary member as a combined structure of the cover 41 and the gas seal unit cover 42 provides the alternating-current voltage application space R41 above the high-voltage side electrode component 1A.

In Embodiment 2, the material gas supply path connected with the discharge space 66 from the outside above the material gas flow path 41h is formed by the material gas flow path 41h, the material gas flow path 42h and the plurality of through-holes 37h provided in the spacers 37.

Thus, in the active gas generation apparatus according to Embodiment 2, the above-described material gas supply path guided to the discharge space 66 from above the material gas flow path 41h is formed independently from the alternating-current voltage application space R41. In other words, gas flow in the discharge space 66 is completely separated from gas flow in the alternating-current voltage application space R41.

The housing contact space R44 is provided between a side surface 44d of a hollow space part of the metal housing 44 and each of the electrode component installation table 43, the gas seal unit cover 42, a side surface region of a lower part of the cover 41, and part of a bottom surface region at an upper part of the cover 41.

Similarly to the alternating-current voltage application space R31 in Embodiment 1, the alternating-current voltage application space R41 is a space completely independent from the other space by the high-voltage side electrode component 1A, the cover 41, and the gas seal unit cover 42, and the material gas supply path reaching the discharge space 66 is completely separated from the other space. With this configuration, the housing contact space R44 is completely separated from the alternating-current voltage application space R41 and the discharge space 66. In other words, gas flow in the discharge space 66 is completely separated from gas flow in the housing contact space R44.

As a result, similarly to Embodiment 1, the active gas generation apparatus according to Embodiment 2 can reliably avoid the first and second mixing phenomena, thereby achieving the effect of discharging high quality active gas to the outside.

In addition, similarly to Embodiment 1, the active gas generation apparatus according to Embodiment 2 can supply the purge gas into the alternating-current voltage application space R41 through the purge gas supply port 41p, and thus any evaporation material generated when anomalous discharge occurs in the alternating-current voltage application space R41 can be removed to the outside through the purge gas discharge port 41e.

Unlike Embodiment 1, no side surface space R33 is provided as the material gas supply path in Embodiment 2, which can enhance the function of shielding the material gas between the material gas supply path and each of the alternating-current voltage application space R41 and the housing contact space R44.

In addition, the active gas generation apparatus according to Embodiment 2 includes the gas seal unit cover 42 functioning as the electrode group holder configured to solely hold the active gas generation electrode group 301.

Since Embodiment 2 has this characteristic, the combined structural body of the active gas generation electrode group 301 and the gas seal unit cover 42 can be transported as a necessary minimum component when the active gas generation electrode group 301 needs to be replaced in maintenance or the like, which leads to improvement of convenience.

When the active gas generation electrode group 301 needs to be replaced in the active gas generation apparatus according to Embodiment 1, the active gas generation electrode group 301 needs to be transported alone, or "the electrode component installation table 33+the active gas generation electrode group 301+the covers 31 and 32" need to be collectively transported as one combined structural body.

In the former transport case, it is cumbersome that the high-voltage side electrode component 1A and the ground side electrode component 2A need to be individually transported and it is not easy to fix the components, which causes a problem with increase of the risk of damage on the high-voltage side electrode component 1A or the ground side electrode component 2A mainly made of ceramic. In the latter transport case, it is a problem that the combined structural body is too large as a minimum unit.

In the active gas generation apparatus according to Embodiment 2, however, the combined structural body of the active gas generation electrode group 301 and the gas seal unit cover 42 can be transported as a necessary minimum component, and thus the above-described problems in Embodiment 1 do not occur.

<Embodiment 3>

Embodiment 3 has the same basic configuration as that of Embodiment 1 illustrated FIGS. 1 and 2 or Embodiment 2 illustrated in FIG. 3. Specifically, the discharge space 66, the alternating-current voltage application space R31 (R41), and the housing contact space R34 (R44) are completely separated from one another, and thus gas generated in one of the spaces does not mix into the other spaces.

In Embodiment 3, the pressure in the discharge space 66 is substantially set to be a relatively low atmospheric pressure of 10 kPa to 30 kPa approximately. In this pressure setting, the material gas is, for example, gas containing nitrogen of 100%.

In the discharge space 66 as a space in which a discharge D1 is generated to activate the material gas, the discharge D1 desirably starts at a lower voltage. The discharge D1 is caused by insulation breakdown of the gas when the electric field intensity exceeds a particular value.

The electric field intensity that causes insulation breakdown is determined by the kind of the material gas and the pressure, and is lower at a lower pressure in the vicinity of atmospheric pressure. For this reason, the above-described pressure setting is applied to the discharge space 66.

It is desirable not to generate discharge as much as possible in the alternating-current voltage application space R31 (R41) and the housing contact space R34 (R44). The most reliable method of preventing anomalous discharge from being generated as unexpected discharge is to provide a sufficient insulation distance, but the distance is limited due to problems with the installation space of the active gas generation electrode group 301, and thus in Embodiment 3, the electric field intensity at insulation breakdown is increased by increasing the pressure. However, the pressure has an upper limit value substantially determined by the strength of components, and thus the pressure at the alternating-current voltage application space R31 and the housing contact space R34 is desirably 100 kPa to 300 kPa (absolute pressure) approximately.

In the structure described in Embodiment 1 or Embodiment 2, the discharge space 66 and a gas layer in each of the alternating-current voltage application space R31 and the housing contact space R34 are separated from each other, and thus it is possible to perform such pressure setting suitable for each of the discharge space 66, the alternating-current voltage application space R31, and the housing contact space R34 that the discharge D1 in the discharge space 66 occurs at a lower applied voltage by setting the pressure in the discharge space 66 to be lower than the pressure in the alternating-current voltage application space R31 and the housing contact space R34, and that the discharge is reduced by setting a relatively high pressure in the alternating-current voltage application space R31 and the housing contact space R34.

In this manner, the active gas generation apparatus according to Embodiment 3 can set relatively low pressure in the discharge space 66 so that a discharge phenomenon occurs at a lower applied voltage, and can set relatively high pressure in the alternating-current voltage application space R31 and the housing contact space R34 so that no discharge phenomenon occurs.

The present invention is described above in detail, but the above description is exemplary in any aspect, and the present invention is not limited to the description. Numerous modifications not exemplarily described would be thought of without departing from the scope of the present invention.

The invention claimed is:

1. An active gas generation apparatus comprising:
   an active gas generation electrode group including a first electrode component and a second electrode component provided below said first electrode component;
   an alternating-current power source unit configured to apply alternating-current voltage to said first and second electrode components so that said first electrode component is at a high voltage, a discharge space being formed between said first and second electrode components through application of said alternating-current voltage by said alternating-current power source unit, an active gas obtained by activating a material gas supplied to said discharge space being ejected through a gas ejection port provided in said second electrode component;
   a first auxiliary member provided to form an alternating-current voltage application space between said first auxiliary member and said first electrode component separately from said discharge space;
   a second auxiliary member made of a non-metallic material and supporting said active gas generation electrode group from said second electrode component side, said second auxiliary member including an auxiliary member gas discharge port through which the active gas ejected from said gas ejection port passes; and
   a housing made of metal that houses all of said active gas generation electrode group and said second auxiliary member and at least part of said first auxiliary member, said housing including a housing gas discharge port through which the active gas passing through said auxiliary member gas discharge port is discharged to an outside, a housing contact space separated from said discharge space being provided between said housing and each of said first and second auxiliary members, wherein
   said first auxiliary member includes a material gas flow path for a material gas supply path, through which the externally supplied material gas is guided to said discharge space, independently from said alternating-current voltage application space and said housing contact space so that a gas flow in said discharge space and a gas flow in said alternating-current voltage application space are separated from each other and the gas flow in said discharge space and a gas flow in said housing contact space are separated from each other.

2. The active gas generation apparatus according to claim 1, wherein
   said first auxiliary member further includes a second gas supply port through which second gas other than the material gas is externally supplied to said alternating-current voltage application space, and said second gas supply port is provided independently from said material gas flow path.

3. The active gas generation apparatus according to claim 1, wherein
   a pressure in said alternating-current voltage application space is set to be higher than a pressure in said discharge space.

4. The active gas generation apparatus according to claim 1, wherein
   said first auxiliary member includes an electrode group holder solely holding said active gas generation electrode group, and
   said second auxiliary member supports said active gas generation electrode group together with said electrode group holder from said second electrode component side.

* * * * *